United States Patent [19]

Ogita

[11] 4,225,972

[45] Sep. 30, 1980

[54] SYSTEM FOR INDICATING FREQUENCY OF STATION SIGNAL RECEIVED BY SUPERHETERODYNE RADIO RECEIVER

[75] Inventor: Minoru Ogita, Hamamatsu, Japan

[73] Assignee: Nippon Gakki Seizo Kabushiki Kaisha, Hamamatsu, Japan

[21] Appl. No.: 42,780

[22] Filed: May 29, 1979

[30] Foreign Application Priority Data

May 30, 1978 [JP] Japan .................................. 53-64610
May 30, 1978 [JP] Japan .................................. 53-64611

[51] Int. Cl.³ ......................... H04B 1/16; G01R 23/10
[52] U.S. Cl. ...................................... 455/158; 334/86; 358/192.1
[58] Field of Search .......... 325/455; 324/78 D, 79 D; 331/64; 334/86; 358/192

[56] References Cited

U.S. PATENT DOCUMENTS

| | | | |
|---|---|---|---|
| 3,851,254 | 11/1974 | Merrell et al. | 325/455 |
| 3,885,218 | 5/1975 | Pfab | 325/455 |
| 3,938,048 | 2/1976 | Elliott | 325/455 |
| 4,024,477 | 5/1977 | Yamaguchi et al. | 325/455 |
| 4,065,727 | 12/1977 | Johnson, Sr. | 331/64 |

*Primary Examiner*—Marc E. Bookbinder
*Attorney, Agent, or Firm*—Cushman, Darby & Cushman

[57] ABSTRACT

In a station signal frequency indicating system for a superheterodyne radio receiver, a station-signal frequency received by the receiver is evaluated on the basis of the oscillating frequency of a local oscillator in the receiver, the evaluation being compensated for a difference between the tuning frequency of the receiver and the station-signal frequency received. This evaluation is performed by, for instance, counting a signal generated at the local oscillator by a counter, and the compensation of evaluation is accomplished by, for example, varying a preset number for the counter in accordance with the dc-voltage level of the output of a demodulator in the receiver. Such system is capable of indicating a correct station-signal frequency so long as the frequency difference is less than a predetermined value, even when the receiver is not tuned exactly to the station-signal frequency.

17 Claims, 10 Drawing Figures

SYSTEM FOR INDICATING FREQUENCY OF STATION SIGNAL RECEIVED BY SUPERHETERODYNE RADIO RECEIVER

BACKGROUND OF THE INVENTION (a) Field of the Invention

The present invention is related to a system for indicating a broadcasting station frequency received by a superheterodyne radio receiver.

(b) Description of the Prior Art

Some radio receivers incorporate a system for electrically detecting and indicating frequency of a station signal received.

Known station-signal frequency indicating system mentioned above usually is designed so that a signal generated at a local oscillator in the receiver is repetitively counted by a frequency counter which is preset at a fixed number corresponding to an intermediate frequency to which is tuned an IF-amplifier stage of the receiver. The content in this frequency counter at the end of each counting period is displayed on a digital or analog indicator, which represents the local oscillating frequency plus or minus the preset number (Intermediate Frequency). Actually, such an arrangement can give a correct indication of the received station-signal frequency, provided that the receiver is tuned exactly to the station. However, when the receiver is only slightly detuned from the broadcast signal frequency, it is no longer capable of indicating the station-signal frequency, but displays a tuning frequency of the receiver itself, in spite of the same station signal being uninterruptedly received.

SUMMARY OF THE INVENTION

It is, therefore, an object of the present invention to provide an improved station-signal frequency indicating system for a radio receiver, which is capable of indicating the exact frequency of broadcast signal from a station as the broadcast signal is being received by the receiver, even when this receiver is not tuned exactly to the station.

According to the present invention, there is provided a system for indicating a frequency of a station signal received by a radio receiver, which comprises: first means associated with said receiver for producing a signal related with a difference between a tuning frequency of said receiver and the frequency of a station signal received by said receiver; second means for evaluating said station-signal frequency received, on the basis of an oscillating frequency of a local oscillator included in said receiver; third means for controlling the evaluation carried out by the second means in accordance with said signal produced by said first means, whereby said second means is effective to evaluate correctly said station-signal frequency received so long as said frequency difference is less than a predetermined value; and fourth means responsive to said second means for visually indicating said evaluated station-signal frequency.

This and other objects as well as the features and the advantages of the present invention will become apparent from the following detailed description of the preferred embodiments of the present invention when taken in conjunction with the accompanying drawings.

BRIEF DESCRIPTION OF THE DRAWINGS

Throughout the drawings, like parts are indicated by like reference numerals.

DETAILED DESCRIPTION OF THE PREFERRED EMBODIMENTS

Figure 1:
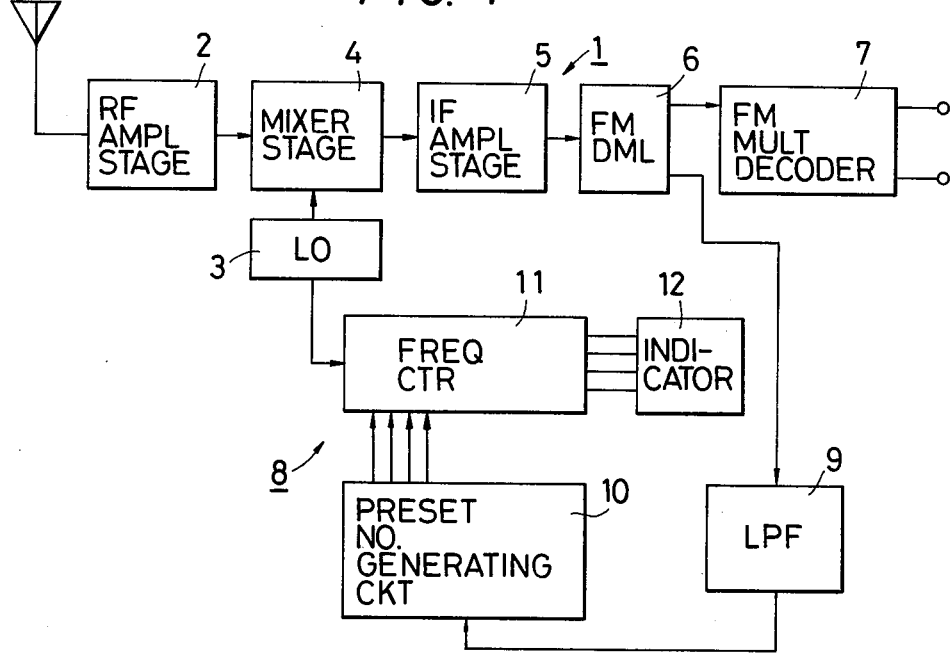
FIG. 1 is a block diagram showing an example of a station-signal frequency indicating system according to the present invention intended for an FM radio receiver.

FIG. 1 shows an embodiment of a station-signal frequency indicating system of the present invention which is incorporated in a popular FM radio receiver indicated at 1. The receiver 1 comprises well-known parts including an RF(Radio Frequency)-amplifier stage 2, a local oscillator 3, a mixer or converter stage 4, an IF(Intermediate Frequency)-amplifier stage 5, an FM demodulator 6, an FM multiplex decoder 7, and a sounding system (not shown). The demodulator 6 is such type that produces a DC output according to the deviation between the received broadcasting station frequency and the tuning frequency of the receiver.

The system of this embodiment is indicated generally at 8 in the Figure, and composed of a low-pass filter 9, a preset-number generating circuit 10, a programmable frequency counter 11, and a digital indicator 12. The output of the demodulator 6 is applied through the low-pass filter 9 to the preset-number generating circuit 10, the output of which is set to the frequency counter 11 at the beginning of each counting period of time for which the counting of signal generated at the local oscillator 3 is carried out by the frequency counter 11. The output of the preset-number generating circuit 10 is a digital representation of a variable preset number for the counter 11 and is generated in dependence upon that value of the output of the low-pass filter 9 which represents the dc-voltage level of the demodulator output. It will be noted, therefore, that the content in the frequency counter 11 at the end of each counting time period represents the oscillating frequency of the local oscillator 3 plus the preset number if the receiver embodies the lower local system. The content in the frequency counter 11 at the end of each counting time period is fed to the indicator 12 to be displayed.

The variable preset-number mentioned above is controlled by the demodulator output such that the frequency of a station may be constantly indicated by the indicator so long as the station-signal is received by the receiver, irrespective of whether or not the receiver is tuned correctly to the station-signal frequency. More particularly, when the receiver is completely tuned to or completely detuned from a station-signal frequency, the preset number assumes a reference value corresponding to an intermediate frequency to which the IF-amplifier stage is tuned; whereas when the receiver is slightly detuned from a station-signal frequency, the preset number is changed from the reference value by an amount according to the difference between the tuning frequency of the receiver and the frequency of the station signal.

Figure 2:
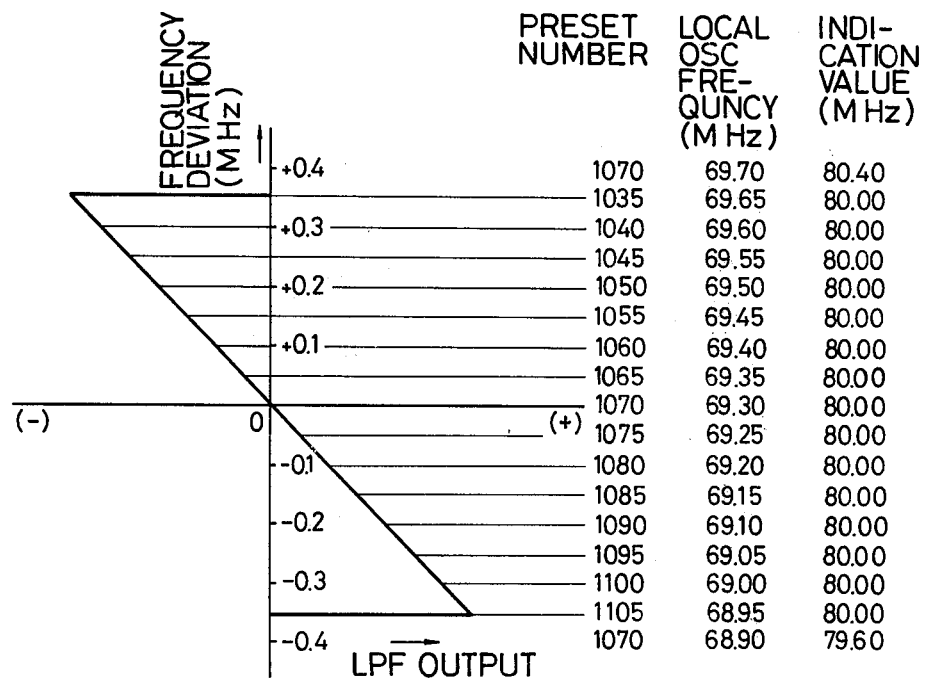
FIG. 2 is a schematic chart for explaining the operation of the embodiment shown in FIG. 1.

Suppose now that the intermediate frequency is 10.70 MHz, the oscillating frequency of the local oscillator 3 is lower than the tuning frequency of the receiver, the station-signal frequency is 80.00 MHz, and that the frequency counting operation is carried out in the order of 10 kHz. In this case, the preset number is varied with the output voltage of the low-pass filter 9 in such relation as shown in FIG. 2. In FIG. 2, the abscissa represents the output voltage of the low-pass filter 9, the ordinate represents a deviation of the tuning frequency of the receiver from the station-signal frequency received by the receiver. Preset number, local oscillating frequency and indication on the indicator 12 are shown as being related with the ordinate.

Figure 3:
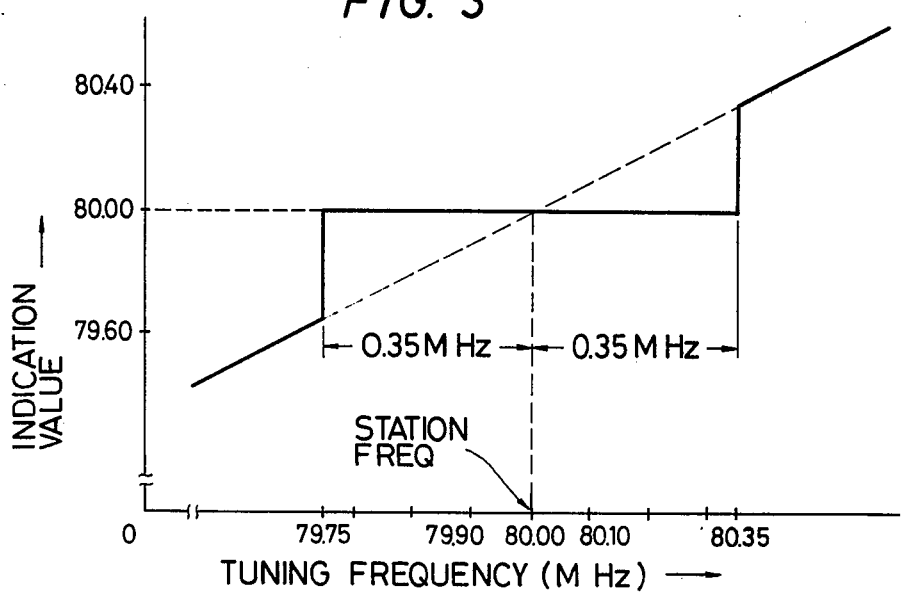
FIG. 3 is a chart for showing a change in indication value obtained by the embodiment shown in FIG. 1 as the tuning frequency of the receiver is altered.

Referring now to FIG. 2, in case the receiver is tuned correctly to, for example, 80.00 MHz which is a station-signal frequency received by the receiver, the output of the low-pass filter 9 is zero volt, and the local oscillating frequency is 69.30 MHz (=80.00−10.70), and the preset number is 1070. Then, an indication of 8000 (=6939+1070) is observed on the indicator 12 which preferably indicates the count value on the basis of MHz such as "80.00". If the receiver is slightly detuned toward higher frequency side and is tuned to 80.20 MHz, there is a deviation of +0.2 MHz between the tuning frequency of the receiver and the received station-signal frequency (80.00 MHz). At such time, the local oscillating frequency is 69.50 MHz (=80.20−10.70) but the preset number is set to be 1050, so that the indicator 12 indicates 80.00 MHz (=preset number+local oscillating frequency value in the order of 10 kHz). As such, so long as the frequency deviation of the tuning frequency from a station-signal frequency is within ±0.35 MHz, for example, the indicator 12 continues the indication of the exact frequency of the station signal received. For a deviation of frequency greater than ±0.35 MHz when the receiver is completely detuned and the DC output of the demodulator 6 is zero, the preset number will attain the fixed reference value, 1070, so that the tuning frequency of the receiver is indicated. The above description is schematically illustrated in FIG. 3, in which the abscissa represents a tuning frequency of the receiver, and the ordinate represents an indication on the indicator 12.

Figure 4:
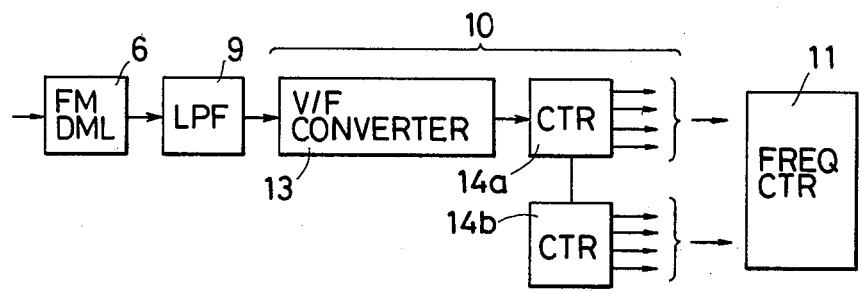
FIG. 4 is a block diagram showing a concrete arrangement of a preset-number generating circuit included in the embodiment shown in FIG. 1.

A concrete arrangement of the aforementioned preset-number generating circuit 10 in FIG. 1 is diagrammatically shown in FIG. 4. In the Figure, the preset-number generating circuit 10 includes a voltage-to-frequency converter 13 which may comprise a voltage-controlled oscillator. The converter 13 converts the output of the low-pass filter to a corresponding signal whose frequency varies from, for instance, 30 Hz downward to zero Hz and upward to 60 Hz in response to the output voltage of the low-pass filter 9. The output signal of the converter 13 is counted by a binary counter 14a whose carry signal, in turn, is counted by another binary counter 14b. Those counters 14a and 14b constitute a sort of frequency divider for producing the preset number in a binary representation, on the basis of the output signal of the converter 13. The content in the counter 14a is adapted to be preset into digits of 10-kHz order in the frequency counter 11, whereas the content in the counter 14b is adapted to be preset into digits of 100-kHz order in the frequency counter 11.

Figure 5:
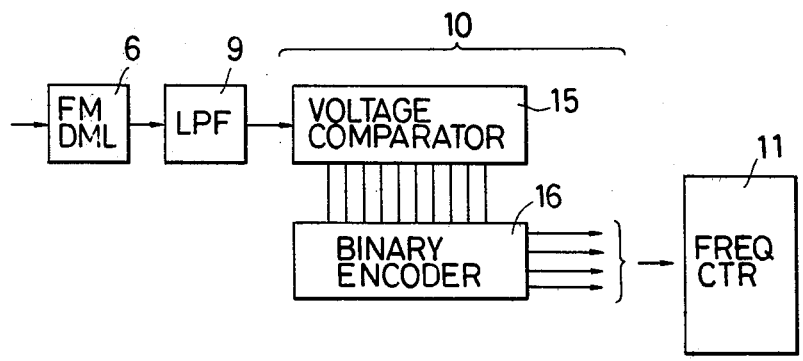
FIG. 5 is a block diagram showing another concrete arrangement of a preset-number generating circuit included in the embodiment shown in FIG. 1.

Another concrete arrangement of the preset-number generating circuit 10 in FIG. 1 is shown in FIG. 5, which comprises a voltage comparator 15, and a binary encoder 16. The comparator 15 implements voltage comparison between the output of the low-pass filter 9 and a plurality of reference voltages, the results of the comparison being delivered out on the output lines as a digital signal in decimal notation. The output of the comparator 15 is converted by the binary encoder 16 into a corresponding binary signal which is a digital representation of the preset number for the frequency counter 11.

Figure 6:
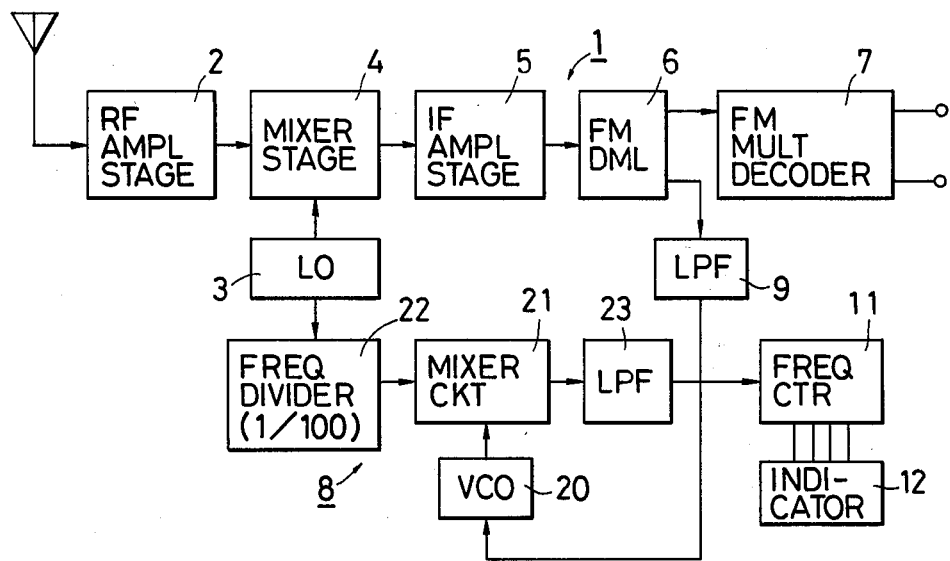
FIG. 6 is a block diagram showing another embodiment of a station-signal frequency indicating system of the present invention.

Another embodiment of a station-signal frequency indicating system according to the preset invention is shown in FIG. 6, which, as indicated generally at 8, comprises a low-pass filter 9, a voltage-controlled oscillator 20, a mixer circuit 21, a frequency divider 22, another low-pass filter 23, a frequency counter 11, and a digital indicator 12. A signal generated at the local oscillator 3 is frequency-divided through the frequency divider 22, and then it is applied to the mixer circuit 21. The output signal of the voltage-controlled oscillator 20 which is controlled by a DC output of the demodulator 6, is also applied to the mixer circuit 21, where the two inputs are mixed mutually. Only lower frequency components in the output of the mixer circuit 21 are supplied through the low-pass filter 23 to the counter for counting, the content in which counter at the end of each counting period of time being received and displayed by the indicator 12. The voltage-controlled oscillator 20 is supplied with, as a frequency control voltage, the output of the demodulator 6 through the low-pass filter 9, and oscillates at a frequency controlled by the control signal in such a manner that the input signal of the frequency counter 11 may assume a frequency representative of a station frequency received by the receiver. Namely, the combination of the voltage-controlled oscillator 20, the frequency divider 22, mixer circuit 21 and the low-pass filter 23 performes a function analoguous to the function of the preset-number generating circuit 10 in the previous embodiment shown in FIG. 1.

It is assumed here that the IF-amplifier stage 5 is tuned to 10.70 MHz, the oscillating frequency of the local oscillator 3 is lower than a tuning frequency of the receiver, the frequency divider 22 has a division factor of 100, the voltage-controlled oscillator output is 553 kHz when the output of the low-pass filter 9 is zero, and that the frequency counter 11 performs the counting operation in the order of 100 Hz and is preset with a fixed number of 6600.

Under such an assumption, when the receiver is tuned exactly to a station-signal frequency at, e.g. 80.00 MHz, the oscillating frequency of the local oscillator 3 is set at 69.30 MHz (=80.00−10.70), so that a signal of 693 kHz is delivered from the frequency divider 22. Consequently, a signal at a frequency of 140 kHz (=693−553) is supplied from the mixer circuit 21 through the low-pass filter 23 to the counter 11, with the result that the frequency counter 11 counts up to 8000 (=1400+6600) at the end of each counting period. Thus, an indication of 80.00 (MHz) is displayed on the indicator 12.

On the other hand, when the receiver is slightly detuned from the station at 80.00 MHz, for instance, toward lower frequency side by 0.1 MHz, the frequency of the output of the frequency divider 22 is 692 kHz, and the oscillating frequency of the voltage-controlled oscillator 20 is controlled by the demodulator output to be 552 kHz. Hence, the input frequency of the frequency counter 11 is 140 kHz which is the same as that in case of exactly tuned condition, so that the indicator 12 still indicates 80.00 (MHz).

In this way, this instant embodiment can also indicate the exact frequency of a station-signal received by the receiver even when the receiver is not completely tuned to the station signal.

Figure 7:
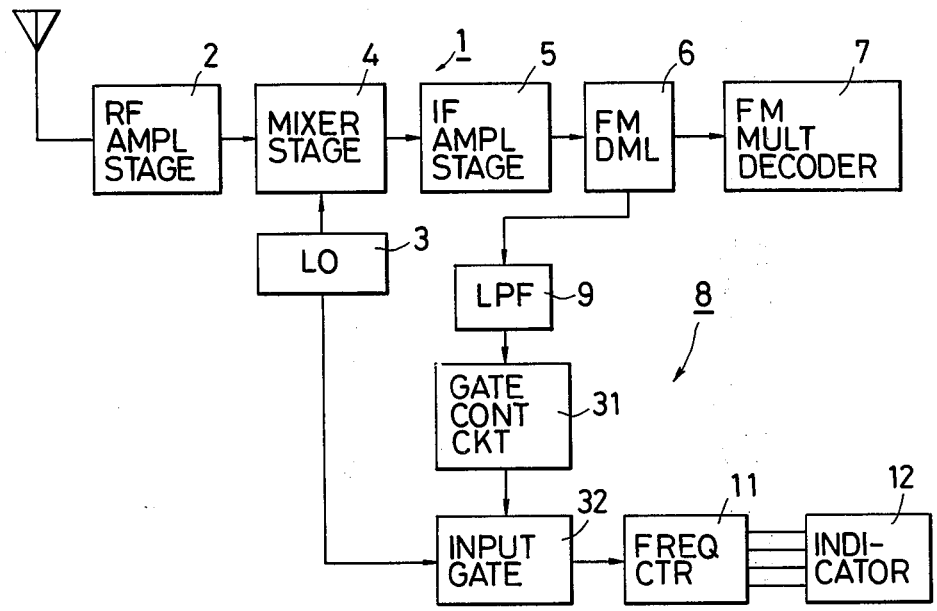
FIG. 7 is a block diagram showing still another embodiment of a station-signal frequency indicating system of the present invention.

Still another embodiment of a station-signal frequency indicating system according to the present invention is shown in FIG. 7, which comprises a frequency counter 11 for repetitively counting the output signal of the local oscillator 3 supplied through an input gate 32, an indicator 12 for displaying the content in the frequency counter 11 at the end of each counting period for the frequency counter 11, and a gate control circuit 31 for generating a gate-control pulse signal with a width variable according to the output voltage of the low-pass filter 9.

When the receiver is tuned exactly to a station-signal frequency, the pulse width of the gate-control pulse signal is a predetermined reference width T. The input gate 32 is enabled during a period of T, the positive cycle of the gate-control pulse signal, to supply therethrough an output signal of the local oscillator 3 to the frequency counter 11. The reference pulse width T is selected so that the frequency counter 11, at the end of each counting time period, attains a content which is representative of the station-signal frequency when the receiver is tuned exactly to the station-signal frequency.

Then, if the tuning frequency of the receiver is slightly deviated from the station-signal frequency, a certain level of positive or negative voltage is delivered out from the low-pass filter 9, and the pulse width of the gate-control pulse signal from the circuit 31 is varied from T through an amount according to the output voltage of the low-pass filter 9. Thus, the period of time during which the input gate is enabled and during which the frequency counter 11 is effective for counting is changed so as to compensate the count of the counter 11 for such deviation of the tuning frequency from the station-signal frequency.

In this way, the exact frequency of a station signal can be observed on the indicator 12 so long as the station signal is received by the receiver even when the receiver is slightly detuned from frequency of the station signal.

Figure 8:
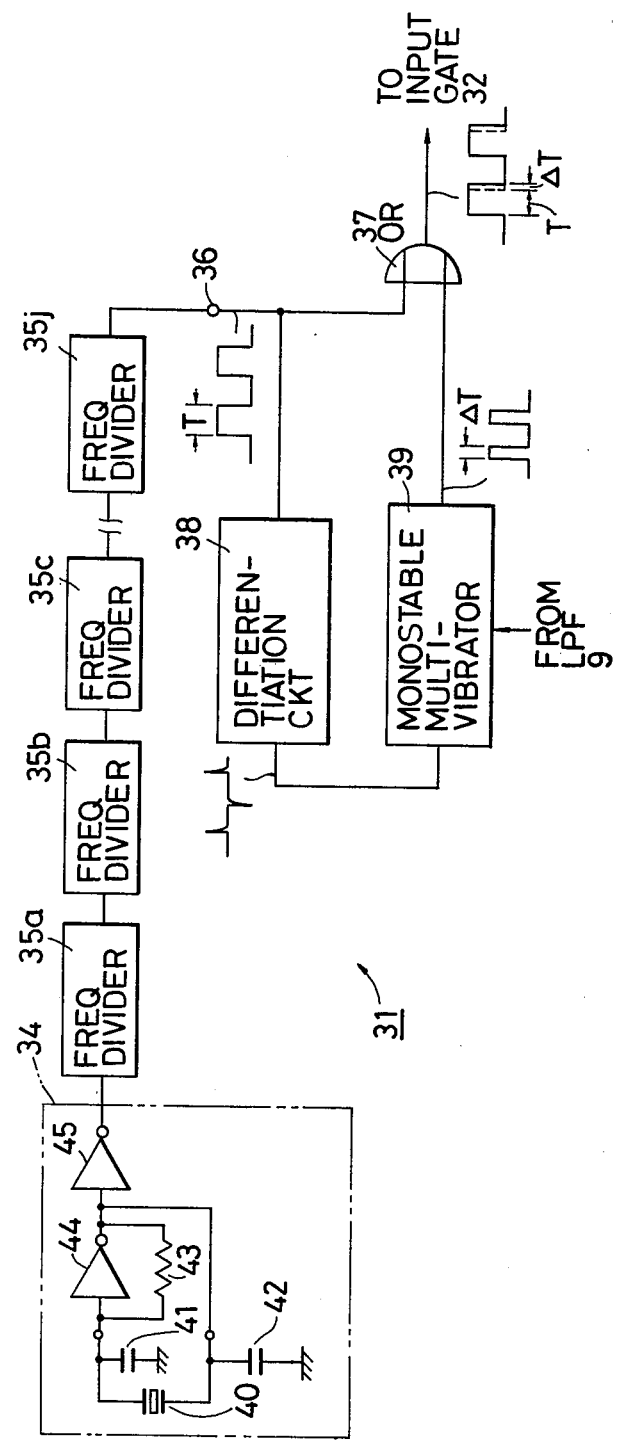
FIG. 8 is a block diagram showing a concrete arrangement of a gate control circuit included in the embodiment shown in FIG. 7.

A concrete arrangement of the gate control circuit 31 in FIG. 7 is shown in FIG. 8, which comprises an oscillator 34, a series of frequency dividers 35a to 35j, an OR gate 37, a differentiation circuit 38, and monostable multivibrator 39 of a voltage-controlled type. A pulse signal generated by the oscillator 34 at a constant rate is frequency-divided through the series of frequency dividers 35a to 35j, so that there is obtained, at a terminal 36, a time-base signal with a constant pulse width T and at a constant rate. The differentiation circuit 38 produces a spike pulse signal which is synchronous with the time-base signal, by the negative spike of which the monostable multivibrator 39 is triggered to generate a pulse signal at the timing of the trailing edge of the time-base signal. The output pulse signal of the multivibrator 39 has a pulse width controlled according to the output voltage of the low-pass filter 9 which is supplied to a control input of the multivibrator 39. Therefore, through the OR gate 37, there is delivered out the aforementioned gate-control signal which is a logical sum of the output of the frequency divider 35j and the multivibrator output.

It this embodiment, the oscillator 34 is constructed as a well-known crystal oscillator which comprises a crystal resonator 40, capacitors 41 and 42, a resistor 43, and inverting amplifiers 44 and 45. It should be noted, however, that the oscillator 34 may be any kind of oscillator circuit with a sufficient frequency stability.

Figure 9:
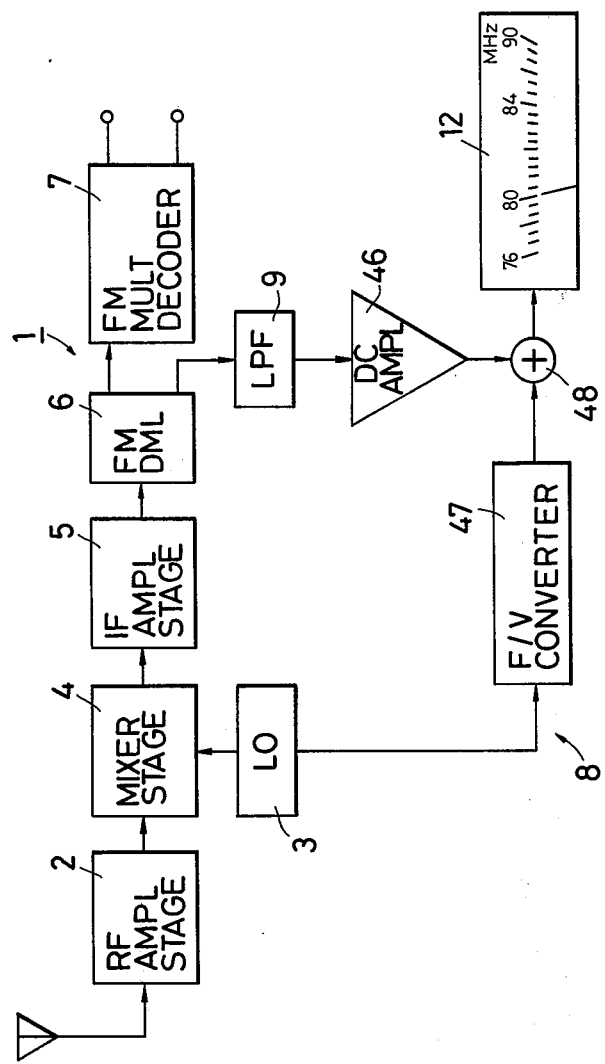
FIG. 9 is a block diagram showing yet another embodiment of a station-signal frequency indicating system of the present invention.

A further embodiment of a station-signal frequency indicating system of the present invention is shown in FIG. 9, which, as indicated generally at 8, comprises a low-pass filter 9, a dc-amplifier 46, a frequency-to-voltage converter (F/V converter) 47, an analog adder 48, and an indicator 12 which is an analog meter. The F/V converter 47 receives a signal generated at the local oscillator 3, and delivers out a dc-voltage with a value related with the oscillating frequency of the local oscillator 3. The output of the demodulator 6 is fed through the low-pass filter 9 to the dc-amplifier 46 whose output is added to the output of the convert 47 at the adder 48. The resulting voltage delivered from the adder 48 is fed to drive the indicator 12.

When the receiver is tuned exactly to a station, the output of the low-pass filter 9 is substantially zero volt, and therefore the indicator 12 is driven only by the output of the F/V converter 47. The indicator meter 12 is calibrated so that, in this condition, it may indicate the exact frequency of the station signal received.

When the receiver is slightly detuned from a station-signal frequency, and when there is a difference between a tuning frequency of the receiver and the station frequency, the dc-amplifier 46 will deliver out a certain level of positive or negative voltage which is substantially proportional to such a frequency difference. Though the voltage level of the output of the F/V converter 47 is somewhat different from a level which would be obtained in the perfect tuning condition of the receiver, such a difference in the level of the converter output is cancelled out by the output of the dc-amplifier 46 at the output of the adder 48. Hence, the exact frequency of the station signal received can be observed on the indicator 12. Namely, the response of the dc-amplifier 46 is designed so as to meet the cancelling by the output thereof.

As such, the instant embodiment can also give an indication of the exact frequency of a station signal received by the receiver even when the receiver is not tuned exactly to the station-signal frequency.

Figure 10:
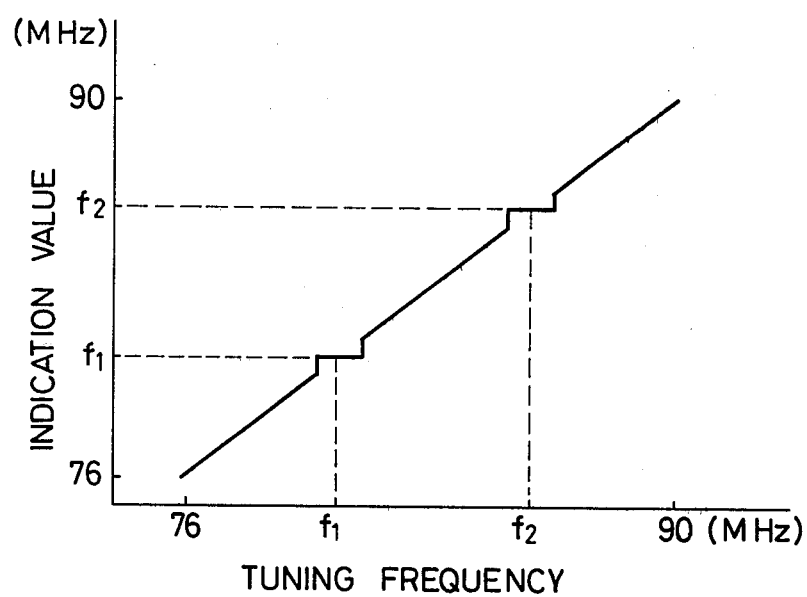
FIG. 10 is a chart for showing a change in indication value obtained by the embodiment shown in FIG. 9 as the tuning frequency is altered.

FIG. 10 shows a curve plotted with indication values (frequencies) on the indicator 12 in FIG. 9 as the tuning frequency of the receiver is varied from 76 MHz to 90 MHz, wherein $f_1$ and $f_2$ designate station-signal frequencies. As seen in FIG. 10, the indicator 12 keeps indicating $f_1$ or $f_2$ so long as the deviation between the tuning frequency of the receiver and the station-signal frequency received is less than a predetermined value.

Though the above description is made on a receiver using the lower local system, it will be apparent that the invention is applicable to the upper local system receiver without departing the scope of the present invention. It is also clear that an AM radio receiver can embody the present invention if such demodulator is used that produces a signal representing the defference between a received broadcasting station frequency and a tuning frequency of the receiver.

What is claimed is:

1. A system for indicating the frequency of a station signal received by a superheterodyne radio receiver, comprising:
    first means associated with said receiver for producing a signal representing a difference between a tuning frequency of said receiver and the frequency of a station signal received by said receiver;
    second means for evaluating the frequency of said station-signal frequency received on the basis of an oscillating frequency of a local oscillator included in said receiver;
    third means for controlling the evaluation carried out by said second means in accordance with said signal produced by said first means, whereby said second means is effective to evaluate correctly said station-signal frequency received so long as said frequency difference is less than a predetermined value; and
    fourth means responsive to said second means for visually indicating said frequency evaluated by said second means.

2. A system according to claim 1, in which: said first means comprises a low-pass filter for receiving the output of a demodulator included in said receiver and for thereby delivering out a dc-voltage related with said frequency difference.

3. A system according to claim 1, in which: said second means includes a first counter for repetitively counting a signal generated by said local oscillator for each counting period, and contents in said first counter at the end of each said counting period are indicated by said fourth means.

4. A system according to claim 3, in which: said third means generates a preset number related with said signal delivered from said first means, and said preset number is set into said first counter at the beginning of each said counting period.

5. A system according to claim 4, in which: said first means comprises a low-pass filter for receiving the output of a demodulator included in said receiver and for thereby delivering out a dc-voltage related with said frequency difference, said preset number varing in accordance with said dc-voltage delivered from said low-pass filter.

6. A system according to claim 5, in which:
    said third means comprises a voltage-to-frequency converter producing a frequency signal according to said dc-voltage delivered from said low-pass filter, and at least one second counter for counting a signal generated by said converter to thereby produce said preset number.

7. A system according to claim 5, in which: said third means comprises a voltage comparator for performing level comparison between said dc-voltage delivered from said low-pass filter and a plurality of reference voltages to deliver a signal representative of a result of the level comparison performed thereby, and an encoder for coding said signals delivered from said voltage comparator into a corresponding digital representation as said preset number.

8. A system according to claim 3, in which: said third means comprises a variable oscillator oscillating at a frequency variable in accordance with said signal delivered from said first means, and circuit means associated with said local oscillator and variable oscillator for generating a signal having a frequency determined by the oscillating frequencies of these two oscillators, said signal generated by said circuit means being counted by said first counter.

9. A system according to claim 8, in which: said first means comprises a low-pass filter for receiving an output of a demodulator included in said receiver and for thereby delivering out a dc-voltage related with said frequency difference, and in which: said variable oscillator comprises a voltage-controlled oscillator oscillating at a frequency varying in accordance with said dc-voltage delivered from said low-pass filter.

10. A system according to claim 8, in which: said circuit means comprises a frequency divider, a mixer circuit for implementing mixing of said signal generated by said variable oscillator and said signal generated by said local oscillator which is frequency-divided through said frequency divider, to thereby produce a signal, and a filter through which said signal from said mixer circuit is applied to said first counter.

11. A system according to claim 10, in which: said filter included in said circuit means comprises a low-pass filter.

12. A system according to claim 3, in which: said third means comprises a gate through which said signal generated by said local oscillator is fed to said first counter for counting and circuit means for enabling said gate for a period of time controlled by said signal delivered from said first means.

13. A system according to claim 12, in which: said circuit means comprises a first pulse generating circuit for generating a pulse signal at a constant rate and with a constant pulse width, a second pulse generating circuit for generating a pulse signal having a variable pulse width in accordance with said signal delivered from said first means and which is synchronous with said pulse signal generated by said first pulse generating circuit, and an OR gate for producing, as a gate control signal, a logical sum signal of said pulse signals generated by said first and second pulse generating circuits, the pulse width of said gate control signal defining a period of time for which said gate is enabled.

14. A system according to claim 13, in which: said second pulse generating circuit includes a monostable multivibrator which is triggered at the trailing edge timing of said pulse signal generated by said first pulse generating circuit.

15. A system according to claim 13, in which: said first pulse generating circuit comprises an oscillator for generating a signal at a constant rate, and at least one frequency divider for frequency-dividing said signal generated by said oscillator to thereby produce said constant pulse signal.

16. A system according to claim 1, in which: said signal delivered from said first means is a dc-voltage, and in which: said second means comprises a frequency-to-voltage converter for receiving a signal generated by said local oscillator and converting it to a dc-voltage with a value corresponding to the oscillating frequency of said local oscillator, and said third means comprises an adder for obtaining a sum signal of said dc-voltages delivered respectively from said first means and frequency-to-voltage converter, said sum signal being representative of said evaluated frequency.

17. A system according to claim 16, in which: said first means comprises a low-pass filter for receiving the output of a demodulator included in said receiver and for thereby delivering out a dc-voltage representing said frequency difference, and a dc-amplifier for amplifying said dc-voltage from said low-pass filter, the output of said dc-amplifier being applied to said adder.

* * * * *